United States Patent
Cho (10) Patent No.: US 7,171,597 B2
(45) Date of Patent: Jan. 30, 2007

(54) INPUT/OUTPUT COMPRESSION TEST CIRCUIT

(75) Inventor: Yong Deok Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 436 days.

(21) Appl. No.: 10/734,132

(22) Filed: Dec. 15, 2003

(65) Prior Publication Data

US 2004/0210809 A1      Oct. 21, 2004

(30) Foreign Application Priority Data

Apr. 17, 2003   (KR) .................. 10-2003-0024416

(51) Int. Cl.
*G11C 29/00* (2006.01)
*G01R 31/28* (2006.01)

(52) U.S. Cl. .............. 714/719; 714/734; 714/718; 714/48; 714/30; 365/201

(58) Field of Classification Search .............. None
See application file for complete search history.

(56) References Cited

U.S. PATENT DOCUMENTS

| | | | | |
|---|---|---|---|---|
| 5,557,574 A | * | 9/1996 | Senoo et al. ............... 365/201 |
| 5,864,565 A | * | 1/1999 | Ochoa et al. ............... 714/735 |
| 6,016,561 A | * | 1/2000 | Roohparvar et al. ........ 714/720 |
| 6,058,056 A | * | 5/2000 | Beffa et al. ................. 365/201 |
| 6,163,863 A | * | 12/2000 | Schicht ....................... 714/718 |
| 6,189,121 B1 | * | 2/2001 | Ogawa ........................ 714/733 |
| 6,311,299 B1 | * | 10/2001 | Bunker ........................ 714/719 |
| 6,314,538 B1 | * | 11/2001 | Ochoa et al. ............... 714/724 |
| 6,550,026 B1 | * | 4/2003 | Wright et al. ............... 714/719 |
| 6,665,827 B2 | * | 12/2003 | Ochoa et al. ............... 714/724 |
| 6,731,553 B2 | * | 5/2004 | Fujioka et al. .............. 365/201 |
| RE38,956 E | * | 1/2006 | Beffa et al. ................. 365/201 |
| 7,013,413 B1 | * | 3/2006 | Kim et al. ................... 714/719 |

FOREIGN PATENT DOCUMENTS

JP       2001-210099       8/2001

* cited by examiner

*Primary Examiner*—Albert DeCady
*Assistant Examiner*—John P. Trimmings
(74) *Attorney, Agent, or Firm*—Heller Ehrman LLP (57) ABSTRACT

The I/O compression test circuit performs test on global I/O lines divided into groups after failure occurs, thereby improving repair efficiency. The configuration of the test circuit is simplified by using a reset circuit, reducing the delay time, and thereby decreasing test time. Additionally, two strobe signals enable the I/O compression test circuit to perform a stable operation.

11 Claims, 8 Drawing Sheets

INPUT/OUTPUT COMPRESSION TEST CIRCUIT

BACKGROUND OF THE INVENTION

1. Field of the Invention

The present invention generally relates to an input/output (hereinafter, referred to as 'I/O') compression circuit for testing specific I/O pins instead of testing all I/O pins in a semiconductor memory cell test. More specifically, the present invention provides a test solution for compressing multiple I/O lines divided into several groups by using a precharge circuitry, thereby reducing test time and improving production yield.

2. Description of the Prior Art

In general, an I/O compression test is a method for testing some specific I/O pins instead of testing all I/O pins in a semiconductor memory cell test.

For example, in the case of the X16 memory device with four banks, four I/O pins are used corresponding to the four banks and 16 I/O lines are compressed into one I/O line internal memory chip. Consequently, 16 I/O pins are compared simultaneously. In the same way, all memory cells of the four banks can be simultaneously tested with only four pins if one pin is assigned to each bank.

As a result, test time is greatly decreased and test cost is also reduced because the number of needles of probe cards and the number of channels of test equipment can be reduced.

Figure 1:
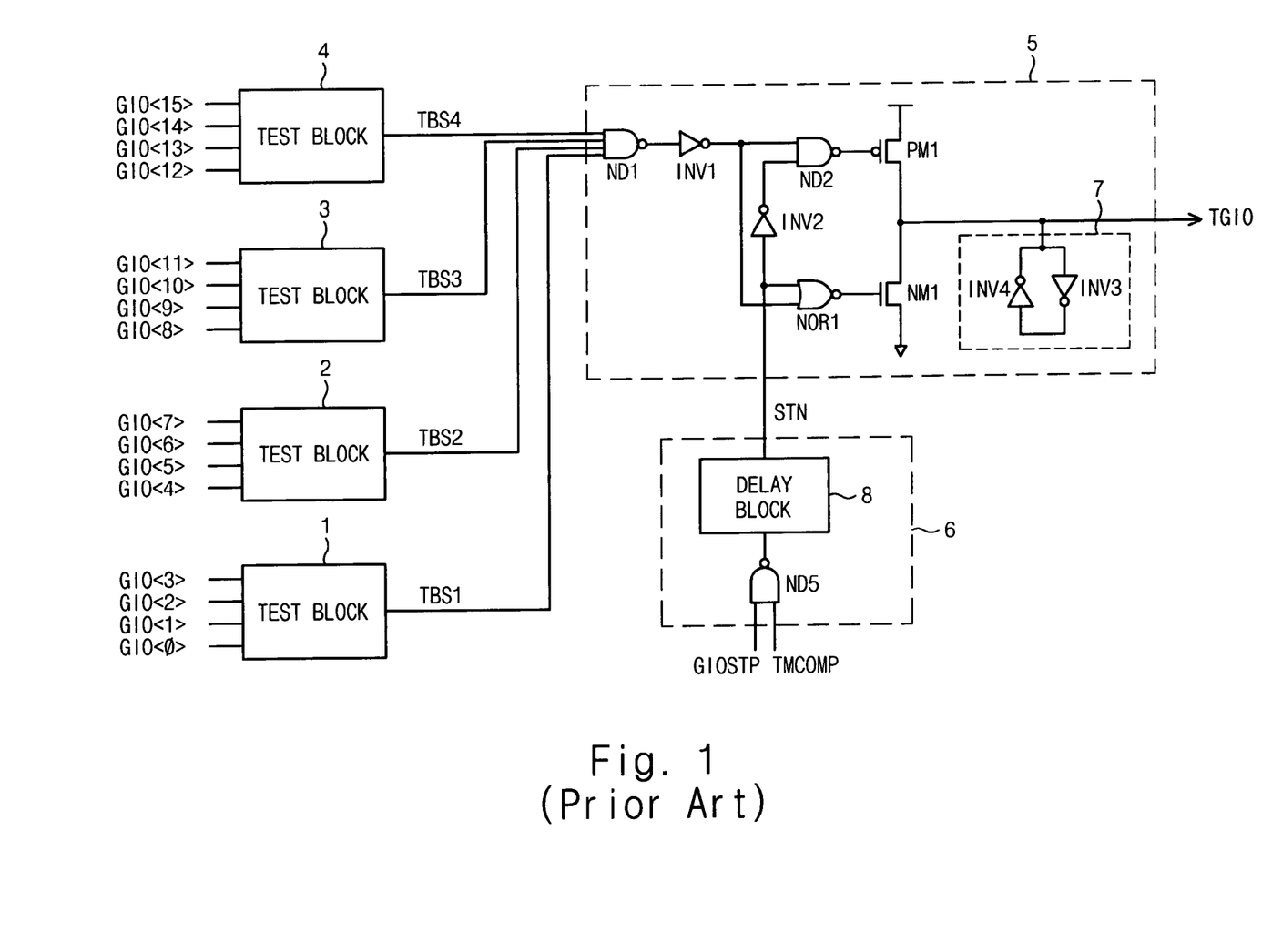
FIG. 1 is a circuit diagram of a conventional I/O compression test circuit.

FIG. 1 is a circuit diagram of a conventional I/O compression test circuit. Here, 16 I/O global lines GIO<0:15> are tested with test data having a high level.

The conventional I/O compression test circuit comprises four test blocks 1~4, a fail detection block 5, and a strobe block 6. 16 I/O global lines GIO<0:15> are divided into four groups, which are tested by the test blocks 1~4. The fail detection block 5 compares test results of the test blocks 1~4 to detect a failure. The strobe block 6 outputs an output signal to the fail detection block 5 synchronously with respect to a strobe signal STN.

Each test block comprises an exclusive NOR gate. That is, each test block discriminates whether data transmitted into the corresponding global I/O lines GIO<0:15> are the same.

The fail detection block 5 comprises NAND gates ND1 and ND2, inverters INV1 and INV2, a NOR gate NOR1, a PMOS transistor PM1, an NMOS transistor NM1 and a latch block 7. The NAND gate ND1 performs an NAND operation on output signals from the test blocks 1~4. The inverter INV1 inverts an output signal from the NAND gate ND1. The inverter INV2 inverts the strobe signal STN. The NAND gate ND2 performs an NAND operation on an output signal from the inverter INV1 and the output signal from the inverter INV2. The NOR gate NOR1 performs an NOR operation on the output signal from the inverter INV1 and the strobe signal STN. The PMOS transistor PM1 has a gate to receive an output signal from the NAND gate ND2. The NMOS transistor NM1 has a gate to receive an output signal from the NOR gate NOR1. The latch block 7 non-inverts and latches a potential of a common drain of the PMOS transistor PM1 and the NMOS transistor NM1. Here, the latch block 7 comprises inverters INV3 and INV4. An output terminal of the inverter INV3 is connected to an input terminal of the inverter INV4 while an output terminal of the inverter INV4 is connected to an input terminal of the inverter INV3.

The NAND gate ND1 outputs a low level signal only when output signals TBS1~TBS4 from the test blocks 1~4 are all at a high level, that is, normal.

As a result, the output signal from the inverter INV1 becomes at a high level. Then, the NAND gate ND2 outputs a pull-up signal having a low level synchronously with respect to the strobe signal STN outputted from the strobe block 6. Thus, the PMOS transistor PM1 is turned on, and an output signal TGIO is pulled up to a high level. Here, the NOR gate NOR1 outputs a pull-down signal having a low level to turn off the NMOS transistor NM1. The output signal TGIO pulled up by the PMOS transistor PM1 is maintained at the high level by the latch block 7.

If one of the output signals TBS1~TBS4 from the test blocks 1~4 becomes at a low level, that is, a failure occurs, an output signal from the NAND gate ND1 becomes at a high level.

The output signal from the inverter INV1 becomes at a low level, and the NAND gate ND2 outputs a pull-up signal having a high level synchronously with respect to the strobe signal STN. As a result, the PMOS transistor PM1 is turned off. Here, the NOR gate NOR1 outputs a pull-down signal having a high level to turn on the NMOS transistor NM1. Then, the output signal TGIO is pulled down to a low level. The output signal TGIO pulled down by the NMOS transistor NM1 is maintained at the low level by the latch block 7.

The strobe block 6 comprises an NAND gate ND5 and a delay block 8. The NAND gate ND5 performs an NAND operation on a signal GIOSTP representing when data are loaded into the global I/O lines GIO and a signal TMCOMP representing a test mode. The delay block 8 delays an output signal from the NAND gate ND5 for a predetermined time. Here, the delay block 8 comprises an even number of inverters.

The strobe block 6 synchronizes a detection timing of the defect detection block 5 with timing when data are inputted into the defect detection block 5. That is, delay time of the delay block 8 is from when test data are transmitted into the global I/O lines GIO to when the data are applied to the defect detection block 5.

Figure 2:
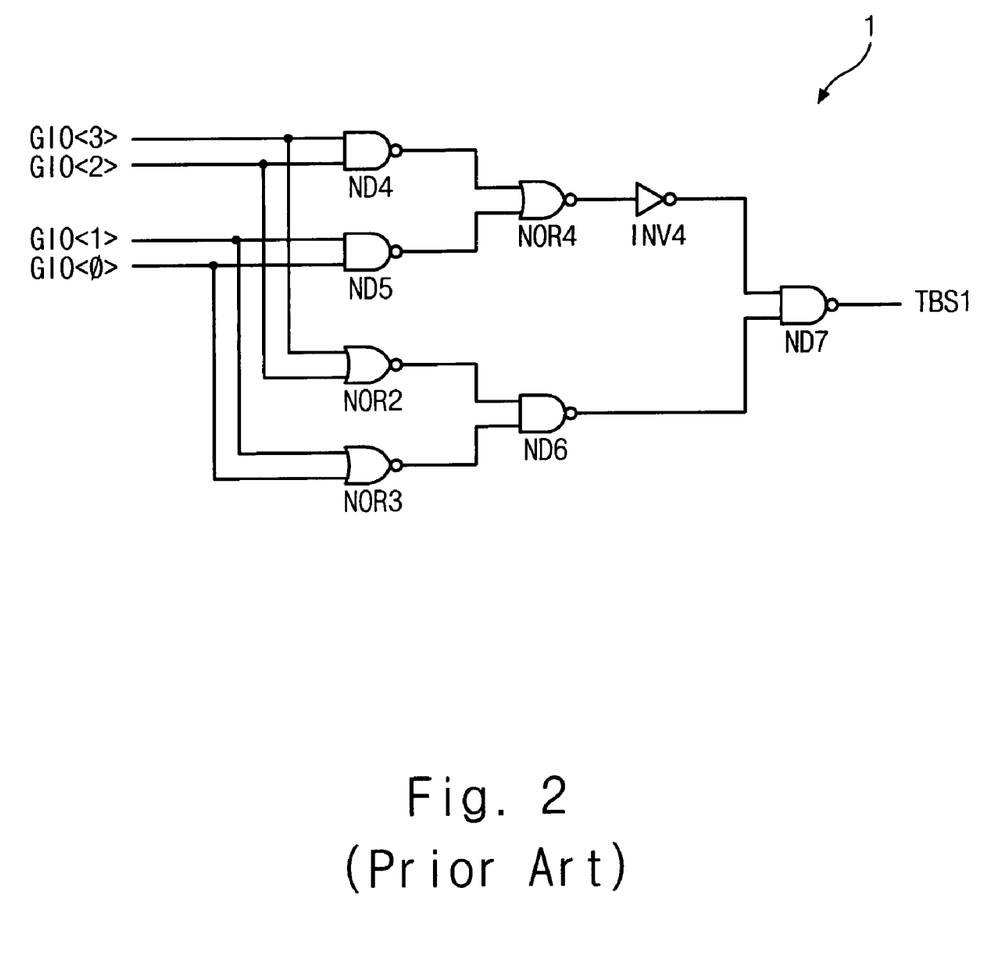
FIG. 2 is a circuit diagram illustrating an example of a test block of FIG. 1.

FIG. 2 is a circuit diagram illustrating an example of the test block 1 of FIG. 1. Test blocks 2~4 have the same structure as that of the test block 1.

The test block 1 comprises NAND gates ND4~ND7, NOR gates NOR2~NOR4, and an inverter INV4. The NAND gate ND4 performs an NAND operation on the global I/O lines GIO<2> and <3>. The NAND gate ND5 performs an NAND operation on the global I/O lines GIO<0> and <1>. The NOR gate NOR2 performs an NOR operation on data of the global I/O lines GIO<2> and <3>. The NOR gate NOR3 performs an NOR operation on data of the global I/O lines GIO<0> and <1>. The NOR gate NOR4 performs an NOR operation on output signals from the NAND gates ND4 and ND5. The inverter INV4 inverts an output signal from the NOR gate NOR4. The NAND gate ND6 performs an NAND gate ND6 on output signals from the NOR gates NOR2 and NOR3. The NAND gate ND7 performs an NAND gate ND7 on output signals from the inverter INV4 and the NAND gate ND6.

When a low level "0" is stored in a memory cell, data of the global I/O lines GIO<0:15> become all at the low level "0" and the test blocks 1~4 output the signals TBS1~TBS4 having a high level. When a high level "1" is stored in a memory cell, data of the global I/O lines GIO<0:15> become all at the high level "1" and the test blocks 1~4 output the signals TBS1~TBS4 having a high level.

If even one of data different from that stored in the global I/O lines GIO<0:15> is outputted, the corresponding test blocks 1~4 output the signals TBS1~TBS4 having a low level.

In the I/O compression test circuit, if the output signal TGIO becomes at the low level and a failure occurs, it is impossible to discriminate a specific global I/O line GIO that caused a failure. As a result, since all cells corresponding to 16 global I/O lines GIO<0:15> are to be required, repair efficiency is degraded and repairable chips are discarded as unrepairable chips.

When the skew exists between the global I/O lines GIO or gates of the test blocks 1~4 have different delay time, a glitch is generated in the output signal from the inverter INV1. If the NAND gate ND2 and the NOR gate NOR1 sample the wrong level caused by the glitch, a normal chip may be considered as a failure chip.

SUMMARY OF THE INVENTION

Accordingly, it is an object of the present invention to improve the repair efficiency by testing global I/O lines divided into groups.

It is another object of the present invention to reduce test time by simplifying configuration of a test circuit.

It is still another object of the present invention to enable stable operation even on skew between global I/O lines and glitch generated in internal circuits by using two sampling clock signals.

In an embodiment, an I/O compression test circuit for compression testing data loaded on a plurality of global I/O lines comprises a plurality of test blocks, a decision block, a driving block and a control block. The plurality of test blocks test a plurality of global I/O line groups depending on a test enable signal. The decision block decides a test result in response to output signals from the plurality of test blocks. The driving block outputs a test result signal in response to a decision signal outputted from the decision block. The control block controls a test timing of the test blocks, initializes an input terminal of the decision block and controls a driving timing of the driving block.

DETAILED DESCRIPTION OF THE PREFERRED EMBODIMENTS

The present invention will be described in detail with reference to the accompanying drawings.

Figure 3:
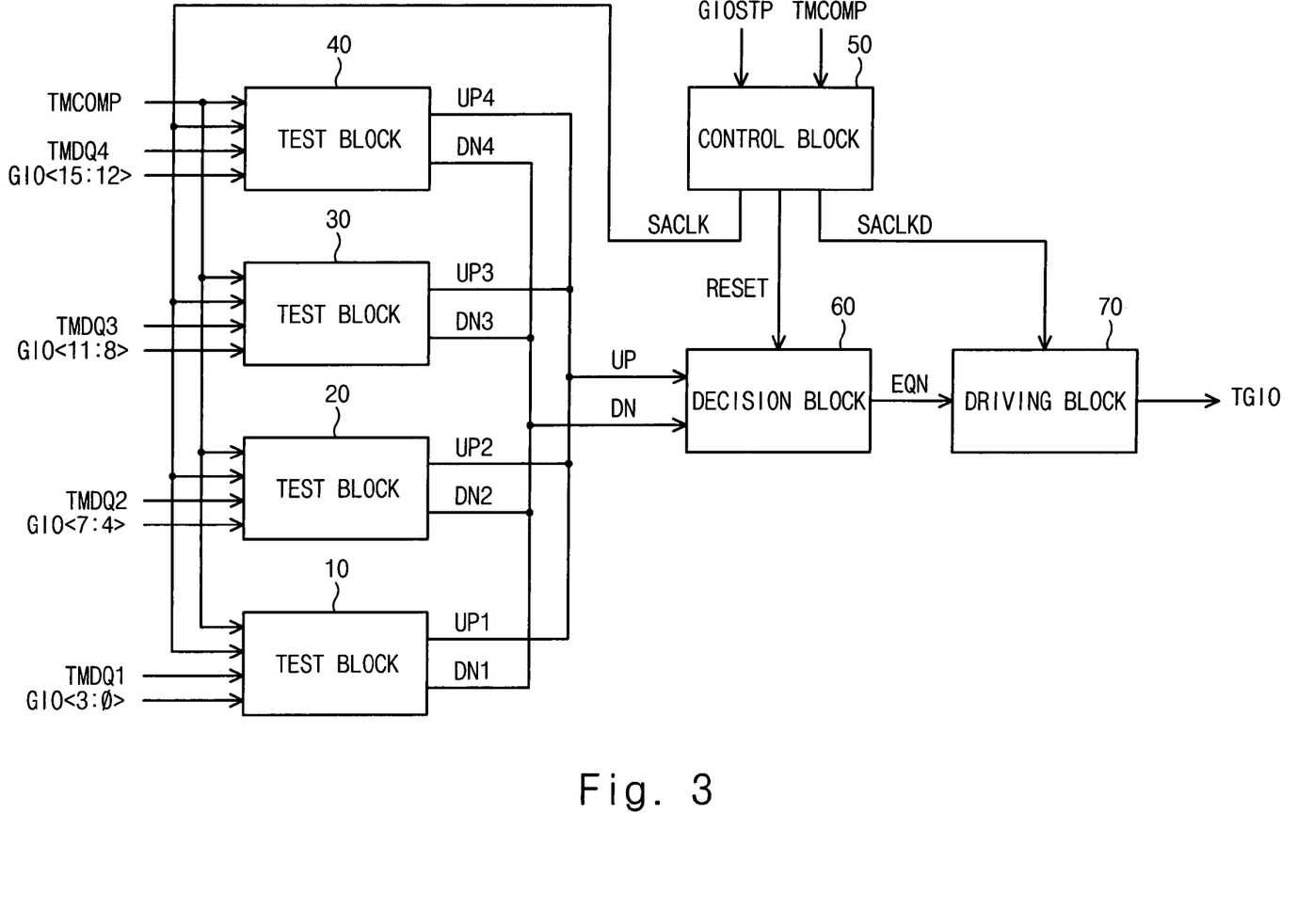
FIG. 3 is a block diagram of an I/O compression test circuit according to an embodiment of the present invention.

FIG. 3 is a block diagram of an I/O compression test circuit according to an embodiment of the present invention.

The I/O compression test circuit tests 16 global I/O lines GIO<0:15> at the same time.

The I/O compression test circuit comprises test blocks 10, 20, 30 and 40, a control block 50, a decision block 60 and a driving block 70. The 16 global I/O lines GIO<0:15> are divided into four groups, which are tested by the test blocks 10, 20, 30 and 40. The decision block 60 decides whether a memory cell is normal by using test results UP and DN of the test blocks 10, 20, 30 and 40, respectively. The driving block 70 synchronizes a decision result EQN of the decision block 60 with a synchronization signal SACLKD, and outputs a test result TGIO. The control block 50 controls the test blocks 10, 20, 30 and 40, the decision block 60 and the driving block 70.

Figure 4:
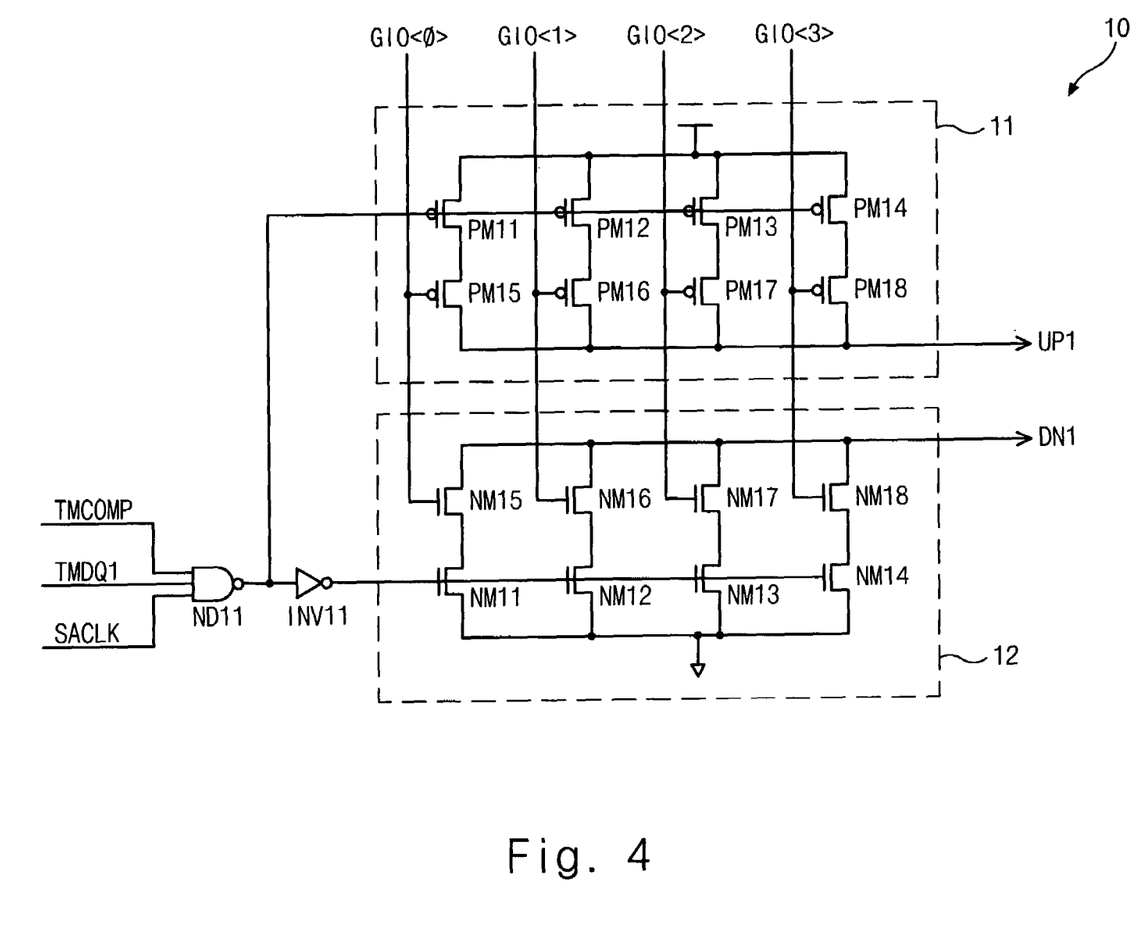
FIG. 4 is a circuit diagram of a test block of FIG. 3.

FIG. 4 is a circuit diagram of the test block 10 of FIG. 3. Test blocks 20, 30, and 40 have the same structure as that of the test block 10.

The test block 10 comprises an NAND gate ND11, an inverter INV11, a pull-up block 11 and a pull-down block 12. The NAND gate ND11 performs an NAND operation on a compression test enable signal TMCOMP, a test block enable signal TMDQ1 and a strobe signal SACLK. The inverter INV11 inverts an output signal from the NAND gate ND11. The pull-up block 11 is controlled by an output signal from the NAND gate ND11, and outputs a test result UP1 having a high level when at least one of data in the global I/O line group GIO<0:3> is at a low level. The pull-down block 12 is controlled by the output signal from the inverter INV11, and outputs a test result DN1 having a low level when at least one of data in the global I/O line group GIO<0:3> is at a high level.

Here, the pull-up block 11 comprises PMOS transistors PM11~PM18. The PMOS transistors PM11~PM14 have gates to receive an output signal from the NAND gate ND11. The PMOS transistors PM15~PM18 have gates connected to the corresponding global I/O lines GIO<0:3>. The PMOS transistors PM11~PM14 have sources to receive a power voltage and drains connected to sources of the PMOS transistors PM15~PM18. Drains of the PMOS transistors PM15~PM18 are connected in common to the output terminal UP1.

The pull-down block 12 comprises NMOS transistors NM11~NM18. The NMOS transistors NM11~NM14 have gates to receive an output signal from the inverter INV11. The NMOS transistors NM15~NM18 have gates connected to the corresponding global I/O lines GIO<0:3>. The NMOS transistors NM11~NM14 have sources connected to a ground voltage and drains connected to sources of the NMOS transistors NM15~NM18. Drains of the NMOS transistors NM15~NM18 are connected in common to the output terminal DN1.

The test blocks 10, 20, 30 and 40 test the corresponding global I/O line groups, individually, by test block enable signals TMDQ1~4. At the initial stage of the test, the test block enable signals TMDQ1~4 are enabled to test the 16 global I/O lines GIO<0:15>. If the test result is normal, a second test is not performed. However, if a failure is found, each test block 10, 20, 30 and 40 performs sequentially a test to find a failed global I/O line group.

When a failure is found in the global I/O lines GIO<0:15>, all 16 global I/O lines GIO<0:15> are not repaired. Instead, the test is performed on each global I/O line group to find a cell corresponding to the global I/O line group having a failure. The repair operation is performed only on the cell, thereby improving repair efficiency.

Figure 5:
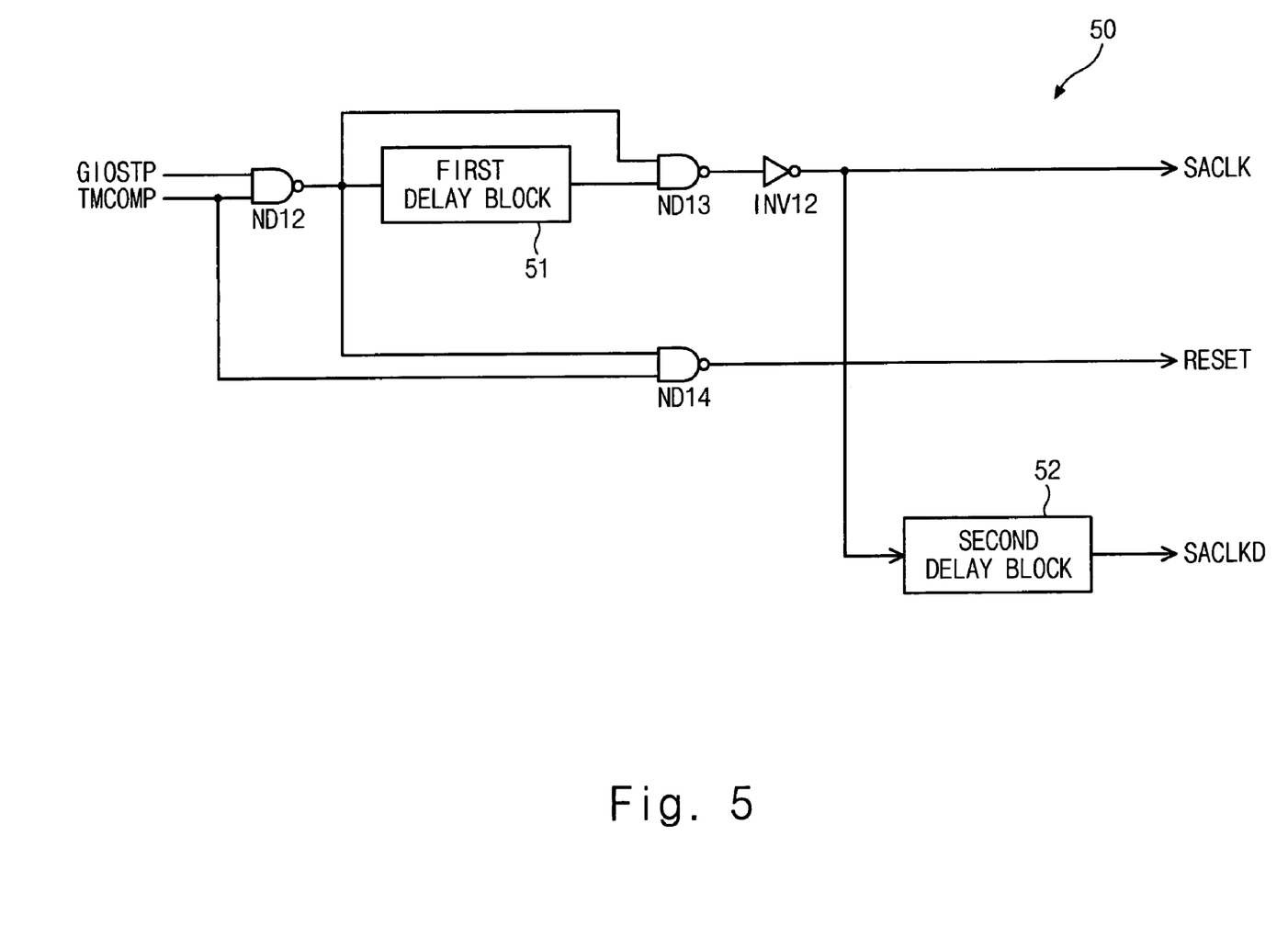
FIG. 5 is a circuit diagram of a control block of FIG. 3.

FIG. 5 is a circuit diagram of the control block 50 of FIG. 3.

The control block 50 comprises NAND gates ND12~ND14, an inverter INV12, a first delay block 51 and a second delay block 52. The NAND gate ND12 performs an NAND operation on a signal GIOSTP representing when data are transmitted into the global I/O lines GIO and a signal TMCOMP representing a test mode. The first delay block 51 delays an output signal from the NAND gate ND12 for a predetermined time. The NAND gate ND13 performs an NAND operation on output signals from the NAND gate ND12 and the first delay block 51. The inverter INV12 inverts an output signal from the NAND gate ND13 to output a strobe signal SACLK. The second delay block 52 delays the strobe signal SACLK outputted from the inverter for a predetermined time to output a delay strobe signal SACLKD. The NAND gate ND14 performs an NAND operation on the signal TMCOMP representing a test mode and the output signal from the NAND gate ND12, and outputs a reset signal RESET. Here, each delay block 51 and 52 comprises an inverter chain including an odd number of inverters.

The control block 50 serves as a corrector for initialization of the whole circuits or for stable operation on skew between the global I/O lines and on glitch generated in a logic circuit device.

strobe signal SACLK as a pulse signal is outputted through the first delay block 51, the NAND gate ND 13, and the inverter INV12. The strobe signal SACLK controls test timing of the test blocks 10, 20, 30 and 40.

The strobe signal SACLK is delayed by the second delay block 52 to output a delay strobe signal SACLKD which controls timing when the driving block 70 outputs a test result TGIO.

The reset signal RESET initializes an output terminal of the decision block 60.

Figure 6:
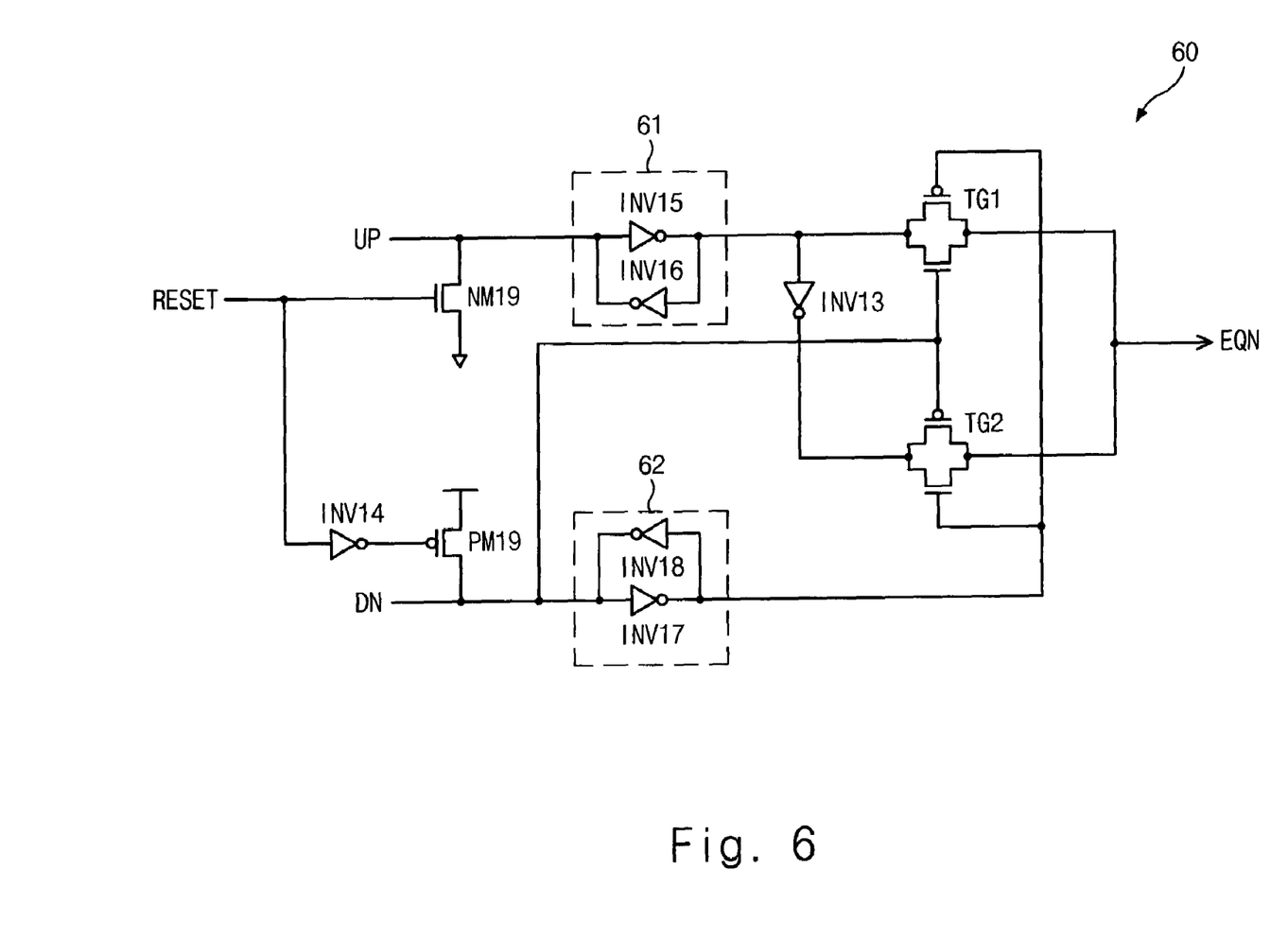
FIG. 6 is a circuit diagram of a decision block of FIG. 3.

FIG. 6 is a circuit diagram of the decision block 60 of FIG. 3.

The decision block 60 comprises latch blocks 61 and 62, inverters INV13 and INV14, an NMOS transistor 19 and a PMOS transistor 19, and transmission gates TG1 and TG2. The first latch block 61 latches a potential of an input terminal UP, and the second latch block 62 latches a potential of an input terminal DN. The first transmission gate TG1, controlled by potentials of the input terminal DN and an output terminal of the second latch block 62, selectively transmits a potential of an output terminal of the first latch block 61. The inverter INV13 inverts a potential of an output terminal of the first latch block 61. The second transmission gate TG2, controlled by potentials of the input terminal DN and an output terminal of the second latch block 62, selectively transmits an output signal from the inverter INV13. The inverter INV14 inverts the reset signal RESET. The NMOS transistor NM19 precharges the input terminal UP to the ground voltage in response to the reset signal RESET. The PMOS transistor PM19 precharges the input terminal DN to the power voltage in response to on output signal from the inverter INV14. Here, the first latch block 61 comprises inverters INV15 and INV16, and the second latch block 62 comprises inverters INV17 and INV18.

If the reset signal RESET is enabled to a high level, the NMOS transistor NM19 and the PMOS transistor PM19 precharge the input terminals UP and DN to the ground voltage and the power voltage, respectively.

When test data having a high level are stored and the test result is normal, output signals UP1~4 from the test blocks 10~40 is floated. As a result, the input terminal UP of the decision block 60 is maintained at a low level and down signals DN1~4 outputted from the test blocks 10~40 become all at a low level.

The first transmission gate TG1 is turned off, and the second transmission gate TG2 is turned on to output a low level signal EQN.

When test data of a high level are stored and a test result is a failure, one of the output signals UP1~4 from the test blocks 10~40 becomes at a high level. The input terminal UP of the decision block 60 becomes at a high level. Therefore, one of the down signals DN1~4 outputted from the test blocks 10~40 becomes at a low level, and the input terminal DN of the decision block 60 becomes at a low level.

As a result, the first transmission gate TG1 is turned off, and the second transmission gate TG2 is turned on to output a high level signal EQN.

When test data of a low level are stored and a test result is a failure, one of the output signals UP1~4 from the test blocks 10~40 becomes at a high level. The input terminal UP of the decision block 60 is maintained at the high level, and one of the down signals DN1~4 outputted from the test blocks 10~40 becomes at a low level.

As a result, the first transmission gate TG1 is turned off, and the second transmission gate TG2 is turned on to output a high level signal EQN.

Figure 7:
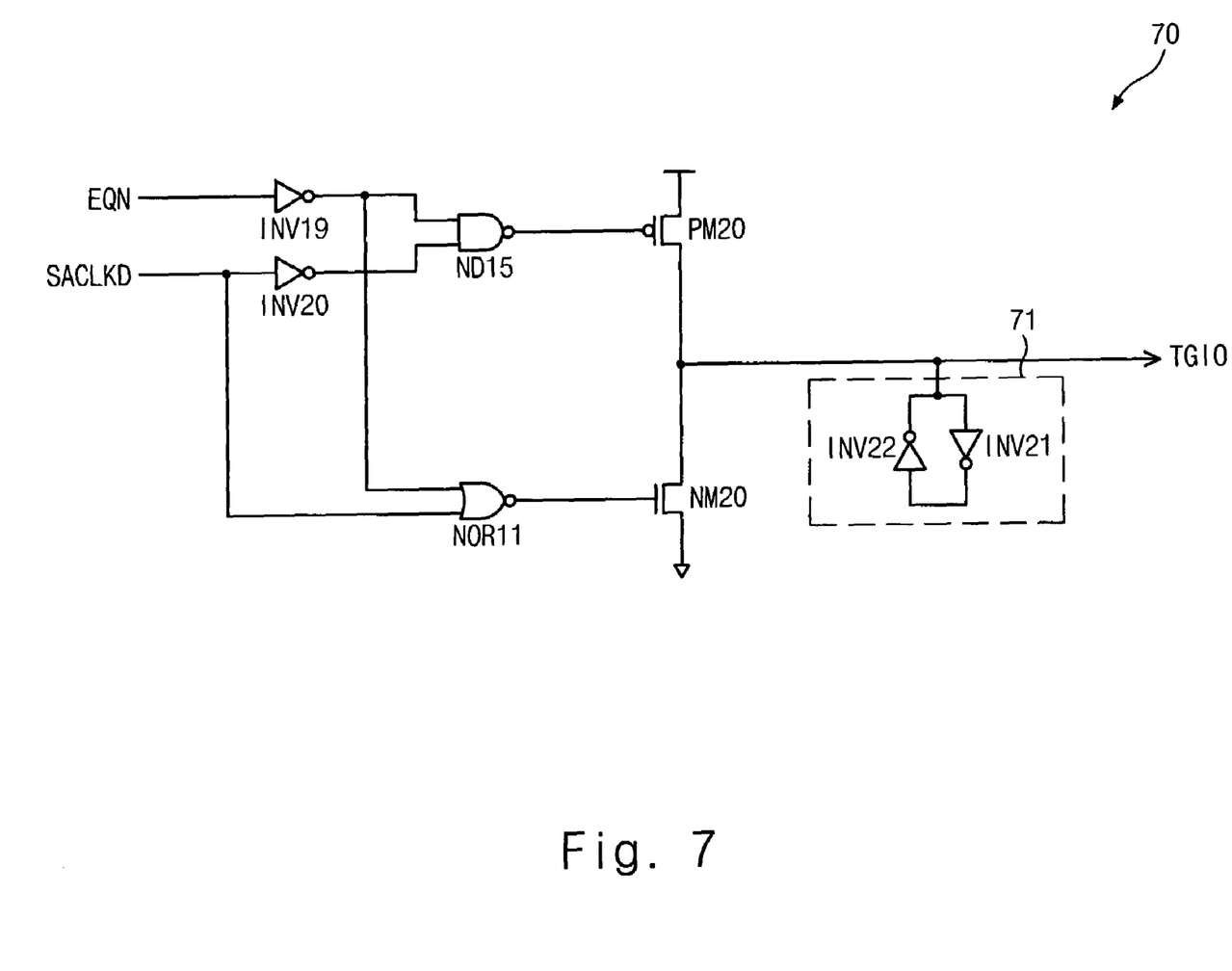
FIG. 7 is a circuit diagram of a driving block of FIG. 3.

FIG. 7 is a circuit diagram of the driving block 70 of FIG. 3.

The driving block 70 comprises inverters INV19 and INV20, a NAND gate ND15, a NOR gate NOR11, a PMOS transistor 20, an NMOS transistor NM20, and a latch block 71. The inverter INV19 inverts the output signal EQN from the decision block 60. The inverter INV20 inverts the delay strobe signal SACLKD. The NAND gate ND15 performs an NAND operation on an output signal from the inverter INV19 and INV20. The NOR gate NOR11 performs an NOR operation on the delay strobe signal SACLKD and an output signal from the inverter INV19. The PMOS transistor PM20 has a gate to receive an output signal from the NAND gate ND15. The NMOS transistor NM20 has a gate to receive an output signal from the NOR gate NOR11. The PMOS transistor PM20 and the NMOS transistor NM20 are connected in series between the power voltage and the ground voltage. The latch block 71 latches a potential of a common drain of the PMOS transistor PM20 and the NMOS transistor NM20. Here, the latch block 71 comprises inverters INV21 and INV22 with a non-inversion latch type. An input terminal of the inverter INV21 is connected to an output terminal of the inverter INV22 while an input terminal of the inverter INV22 is connected to an output terminal of the inverter INV21.

If the test result is normal and the output signal EQN from the decision block 60 is at the low level, the NAND gate ND15 outputs a low level signal. As a result, the PMOS transistor PM20 is turned on. Here, the NMOS transistor NM20 is maintained at a turn-off state because the NOR operation result of the NOR gate NOR11 is at the low level. Thus, the test result TGIO becomes at a high level, and is latched by the latch block 71.

If the test result is decided as a failure and the output signal EQN from the decision block 60 becomes at a high level, the NAND gate ND15 outputs a high level signal to turn off the PMOS transistor PM20. The NOR gate NOR11 outputs a high level signal to turn on the NMOS transistor NM20. Thus, the test result TGIO becomes at a low level, and is latched by the latch block 71.

In a normal read operation, the delay strobe signal SACLKD becomes at a high level to turn off the PMOS transistor PM20 and the NMOS transistor NM20. Thus, the output terminal is floated.

Figure 8:
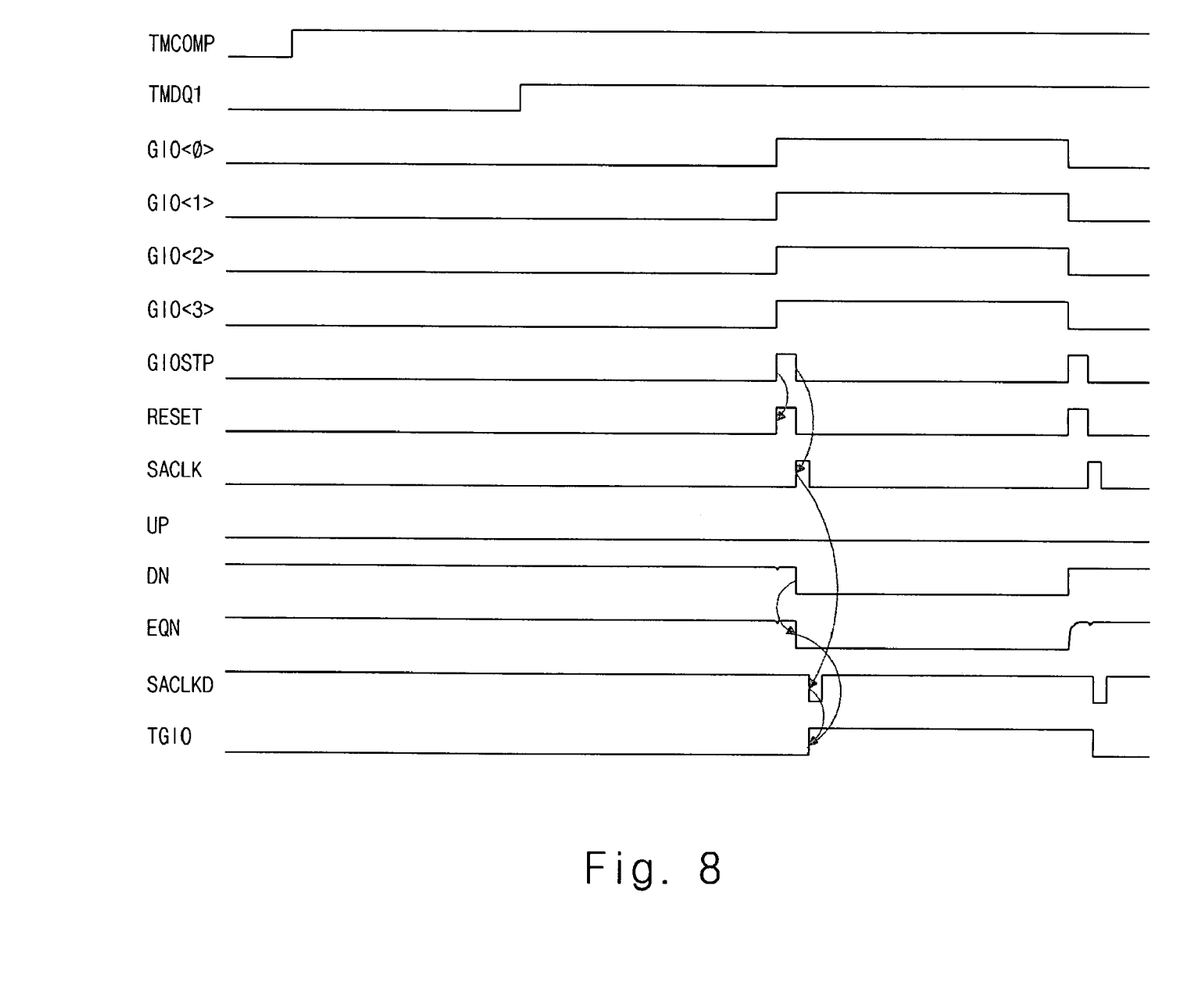
FIG. 8 is a timing diagram illustrating the operation of the I/O compression test circuit of FIG. 3.

FIG. 8 is a timing diagram illustrating the operation of the I/O compression test circuit of FIG. 3. Here, the test data having a high level which are considered as normal are exemplified.

When the compression test enable signal TMCOMP is enabled to a high level and the corresponding test block enable signal TMDQ1 is enabled to a high level, if data are transmitted into the global I/O line groups GIO<0:3>, a high pulse is generated in the global I/O line strobe signal GIOSTP representing when the data are transmitted into the global I/O lines GIO.

If the global I/O line strobe signal GIOSTP is generated, the reset signal RESET and the strobe signal SACLK are generated. Then, the up signal UP1 outputted from the test block 10 is maintained at a low level precharged by the reset signal RESET. The down signal DN1 transits from a high level precharged by the reset signal RESET to low level.

The output signal EQN from the decision block 60 becomes at a low level to turn on the PMOS transistor PM20. As a result, the test result TGIO becomes at the high level.

As described above, an I/O compression test circuit according to an embodiment of the present invention performs a test on global I/O lines at the same time to find a failure. Then, only when a failure occurs, the I/O compression test circuit performs the test on the global I/O lines divided into groups, thereby improving the repair efficiency.

Since the configuration of the test circuit is simplified by using a reset circuit, the delay time generated by a logic circuit device is reduced, thereby decreasing test time.

Additionally, two sampling clock signals enable memory cells to perform a stable operation on skew between global I/O lines or glitch generated in internal circuits.

What is claimed is:

1. An I/O compression test circuit for compression testing data loaded on a plurality of global I/O lines, comprising:
    a plurality of test blocks for testing a plurality of global I/O line groups depending on a test block enable signal synchronously with a first strobe signal, wherein the plurality of global I/O lines are divided into the plurality of global I/O line groups;
    a decision block for deciding a test result in response to output signals from the plurality of test blocks;
    a driving block for driving a decision signal outputted from the decision block synchronously with a second strobe signal; and
    a control block for generating the first strobe signal, a reset signal, and the second strobe signal depending on a compression test enable signal and a global I/O line strobe signal, wherein the reset signal initializes an input terminal of the decision block, wherein the global I/O line strobe signal is activated when data are loaded on the global I/O lines.

2. The circuit according to claim 1, wherein the test blocks comprise:
    a logic means for performing a logic operation on the compression test enable signal, the test block enable signal and the first strobe signal;
    a first test means for outputting a first level when at least one of data transmitted into the global I/O line group is at a different level depending on an output signal from the logic means; and
    a second test means for outputting a second level when at least one of data transmitted into the global I/O line group is at a different level depending on an output signal from the logic means.

3. The circuit according to claim 2, wherein the decision block comprises:
    a first input terminal connected in common to an output terminal of the first test means of the test block;
    a second input terminal connected in common to an output terminal of the second test means of the test block;
    a first transmission means for selectively transmitting a potential of the first input terminal depending on a potential of the second input terminal; and
    a second transmission means for selectively transmitting a signal having an inverted potential of the first input terminal depending on a potential of the second input terminal.

4. The circuit according to claim 3, wherein the decision block further comprises:
    a first latch means for maintaining a potential of the first input terminal; and
    a second latch means for maintaining a potential of the second input terminal.

5. The circuit according to claim 3, wherein the decision block further comprises:
    a first initialization means for selectively initializing a potential of the first input terminal to the first level depending on the reset signal outputted from the control block; and
    a second initialization means for selectively initializing a potential of the second input terminal to the second level depending on the reset signal.

6. The circuit according to claim 1, wherein the driving block comprises:
    a transmission means for selectively transmitting the decision signal outputted from the decision block synchronously with the second strobe signal from the control block; and
    a driving means for pulling up or down an output terminal in response to the decision signal selectively transmitted by the transmission means.

7. The circuit according to claim 6, wherein the driving block further comprises a latch means for maintaining a potential of the output terminal.

8. The circuit according to claim 1, wherein the control block comprises:
    a first strobe signal generator for generating the first strobe signal in response to the compression test enable signal and the global I/O line strobe signal,
    a reset signal generator for generating the reset signal in response to the compression test enable signal and the global I/O line strobe signal, wherein the reset signal initializes an input terminal of the decision block to a predetermined level; and
    a second strobe signal generator for generating the second strobe signal by delaying the first clock signal.

9. The circuit according to claim 8, wherein the first strobe signal generator comprises:
    a logic means for performing a logic operation on the compression test enable signal and the global I/O line strobe signal; and a pulse generator for outputting a pulse signal in response to an output signal from the logic means.

10. The circuit according to claim 8, wherein the initialization signal generator comprises:
a first logic means for performing a logic operation on the compression test enable signal and the global I/O line strobe signal; and
a second logic means for performing a logic operation on the compression test enable signal and an output signal from the first logic means.

11. The circuit according to claim 8, wherein the second strobe signal generator comprises a delay means for delaying the first strobe signal for a predetermined time.

* * * * *